United States Patent [19]

Thompson

[11] Patent Number: 4,517,581
[45] Date of Patent: May 14, 1985

[54] PHOTODETECTOR

[75] Inventor: George H. B. Thompson, Sawbridgeworth, England

[73] Assignee: ITT Industries, Inc., New York, N.Y.

[21] Appl. No.: 442,054

[22] Filed: Nov. 16, 1982

[51] Int. Cl.³ .............................................. H01L 27/14
[52] U.S. Cl. ................... 357/30; 350/96.12; 350/96.14; 357/22; 357/41
[58] Field of Search ........................ 357/30, 22, 15, 41; 350/96.11, 96.12, 96.14

[56] References Cited

U.S. PATENT DOCUMENTS 4,360,246 11/1982 Figueroa et al. .................... 357/30

Primary Examiner—James W. Davie
Assistant Examiner—Georgia Epps
Attorney, Agent, or Firm—John T. O'Halloran; Robert P. Seitter

[57] ABSTRACT

A photodetector in the form of a JFET in which the gate is defined in a rib 5 which is also designed to function as an optically absorbing optical waveguide into which the optical input signal is launched.

10 Claims, 2 Drawing Figures

PHOTODETECTOR

This invention relates to photodetectors and in particular to photodetectors suitable for operation in optical fibre systems. Typically photodetection in such systems relies upon the use of avalanche photodiodes or upon the series combination of a PIN diode and field effect transistor (PIN-FET combination) in which the output of the PIN diode is fed to the gate of an FET.

One of the limitations of a PIN-FET combination is the limitation set by noise considerations. The noise is proportional to the square of the sum of the diode capacitance and the FET gate capacitance divided by the mutual conductance. Noise is therefore reduced if either or both of these capacitance values can be reduced. The present invention is concerned with a modification of the PIN-FET combination in which the two components no longer exist as separate discrete integers but are combined in a manner affording low capacitance.

According to the present invention there is provided a junction field effect transistor photodetector wherein source and drain contacts are provided on a semiconductive layer on opposite sides of a rib of semiconductive material protruding from said layer and carrying the gate contact, wherein the rib has a higher band gap lower refractive index material covering optically absorbing lower band gap higher refractive index material at or immediately beneath the root of the rib disposed such that the rib structure forms an optical waveguide, wherein means are provided for launching the photodetector input signal into said waveguide which is adapted to guide the light of said signal and the absorb it in said optical absorbing material, which material bounds one side of the field effect transistor junction.

There follows a description of photodetectors embodying the invention in a preferred form. The description refers to the accompanying drawings depicting schematic perspective views of two different photodetectors, in which.

The photodetectors of both drawings are designed for operation at a wavelength in the region of 1.3–1.6 microns, and employ quaternary (In,Ga)(As,P) material to absorb the input light signal. The structure of both devices is essentially of a junction FET. The gate of the FET is defined in or immediately beneath a rib formed in semiconductive material to provide a waveguiding structure. The input light signal is guided by this structure and whilst being guided it is absorbed. This permits the use of a relatively slender gate contact affording relatively low gate capacitance and high mutual conductance.

Figure 1:
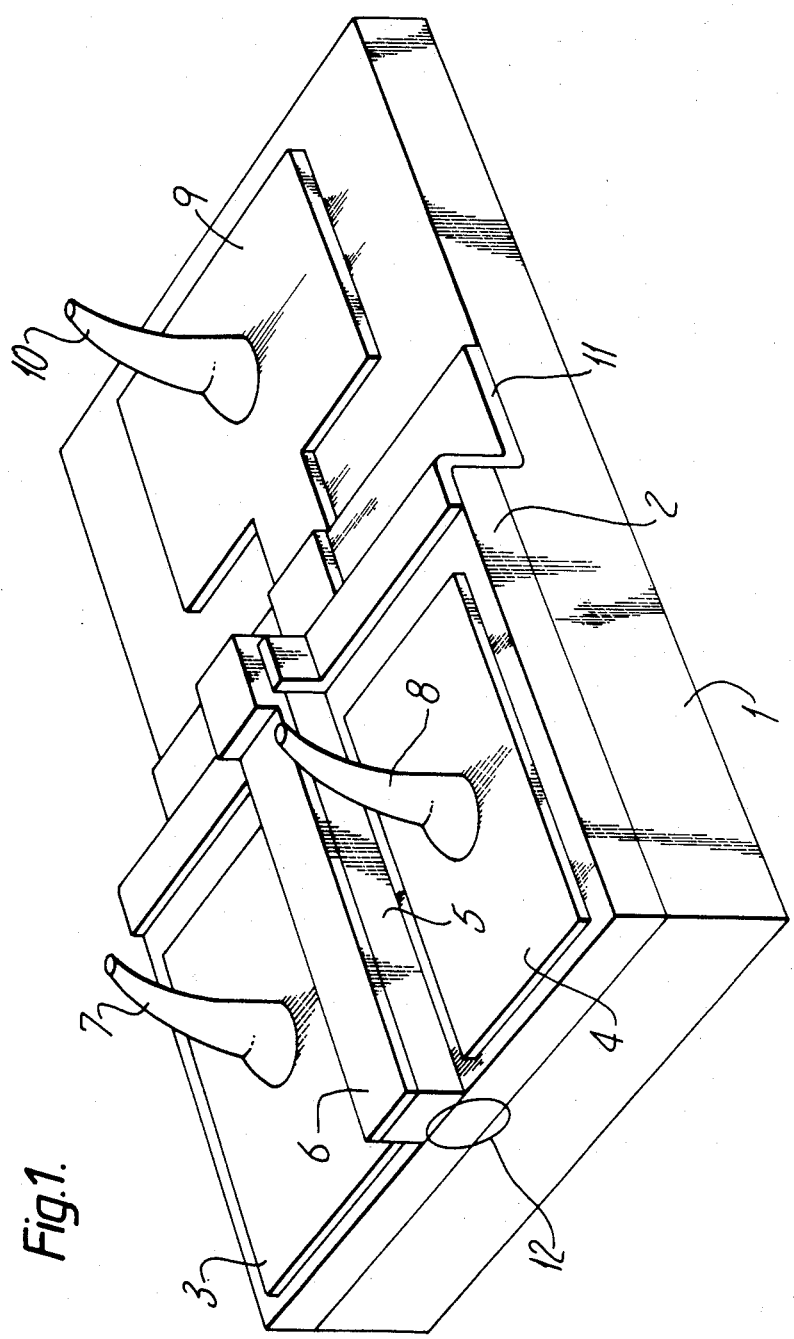
FIG. 1, illustrates a preferred embodiment of the present invention.

The photodetector of FIG. 1 is grown upon a semi-insulating substrate 1 of indium phosphide. This substrate is covered with an epitaxially grown layer 2 of n-type lattice matched (In,Ga)(As,P) on which are formed source and drain contacts 3 and 4, typically of gold tin. Between these contacts is a rib 5 of epitaxially grown p-type indium phosphide, typically 1 to 1.5 microns wide and 20 to 50 microns long. This rib is provided with metallisation, typically of gold zinc, forming the gate contact 6.

Direct bond connection 7 and 8 are made with the source and drain contacts, but the gate contact 6 is too narrow for a direct connection to be made, and so the contact is extended to a pad 9 large and robust enough for a bond 10. In order that this pad 9 shall not contribute unnecessary gate capacitance it should not be formed on any part of the n-type layer that is not isolated from the gate region. The pad is conveniently formed on a portion of the semi-insulating substrate 1 exposed by etching a depression through the overlying layers. An electrically insulating masking layer 11, for instance of silica, is deposited over the edge of the depression to prevent the gate contact from shorting the p-n junction where it is exposed at the side of the depression. Alternatively the insulating mask can be dispensed with if the pad 9 is provided on a part of the n-type layer isolated from the gate region by a narrow trough etched deep enough to expose the semi-insulating substrate at its bottom. The contact is provided before the etching of the trough which is then etched with a suitably undercutting etchant to remove the material from under the contact in the region of the trough and thereby produce a bridging contact that spans the trough.

The indium phosphide of the rib has a lower refractive index than the quaternary material of the underlying layer whose composition is chosen to provide the appropriate band gap for absorbing light at the wavelength of the input signal for which the detector is designed. Thus the rib structure acts as a waveguide for the optical input signal which is launched into the end face under the rib in the region indicated generally at 12. The guided light is progressively absorbed by the absorbing layer as the light propagates towards the other end of the rib, and the length of this rib is chosen having regard to the competing requirements of having a short rib to minimise capacitance and having a long rib to maximize the absorption and hence detection efficiency.

In order to achieve good efficiency with the structure of this device it is necessary to achieve a good match between the optical distribution over the input beam and that of the propagating modes of the rib structure. The output of a typical optical fibre may require to be coupled to the photodetector via some form of 'transformer' length of waveguide in order to improve coupling efficiency. This may take the form of a suitably shaped length of optical fibre whose cross section is a function of position along its length. Alternative it may be provided by a waveguide that is formed by an integral part of the semiconductive material from which the photodetector itself is constructed. Such an arrangement is provided by the photodetector of FIG. 2.

Figure 2:
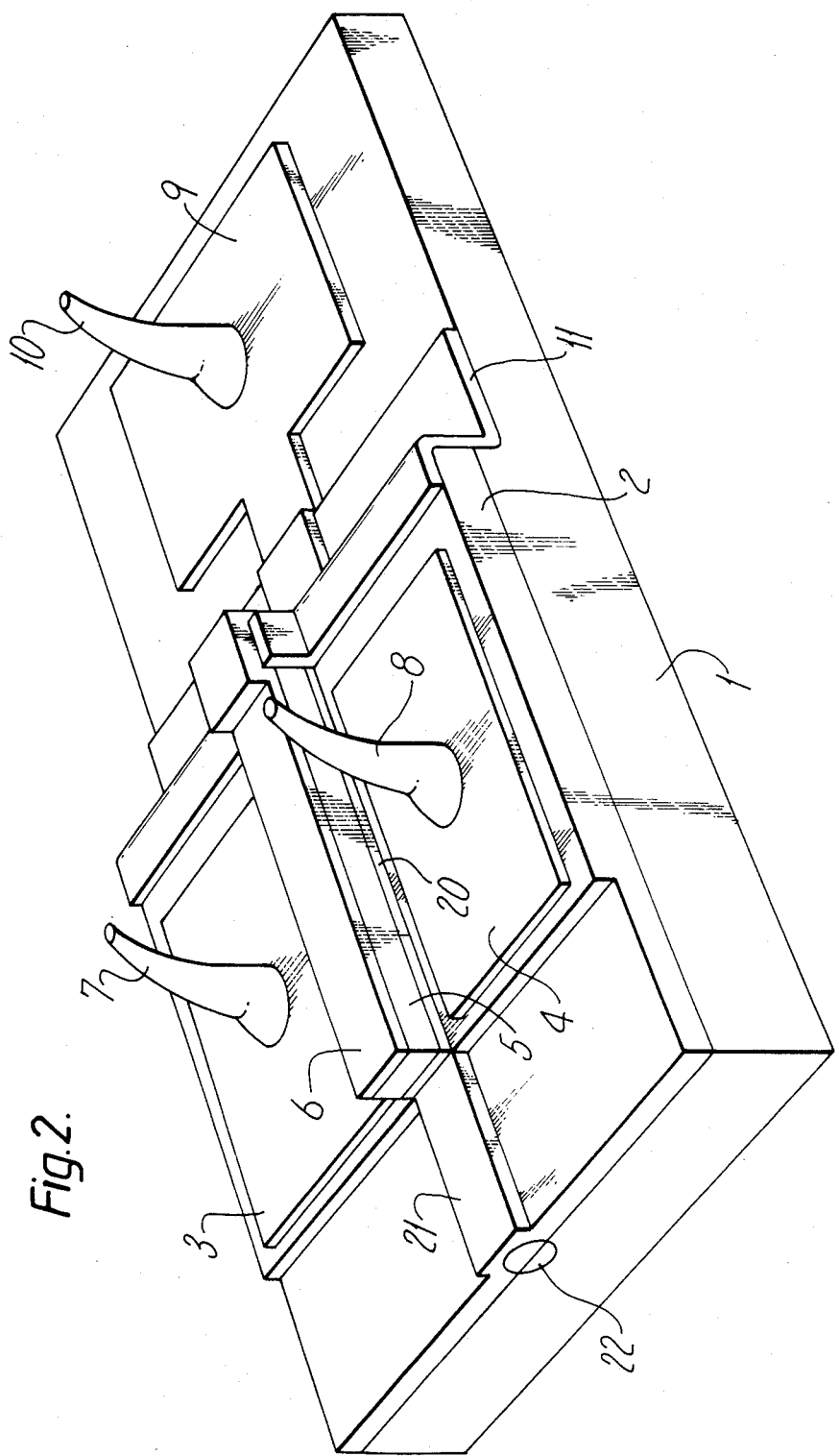
FIG. 2, illustrates a modification of the preferred embodiment of the present invention.

Referring to FIG. 2, the photodetector construction employs a configuration of components that is similar to those of the photodetector of FIG. 1 except for the inclusion of an additional strip of lattice matched quaternary 20 material between the indium phosphide of the rib and the quaternary material of the layer in which the source and drain are defined. (Components that are common to both photodetectors are identified by the same reference numerals in the two figures.) The composition of the strip 20 is chosen to have a smaller band gap and higher refractive index than that of the quaternary material of layer 2 so that in this instance it is the strip 20 that absorbs the input light rather than layer 2. The strip 20 may be p-type or n-type.

The rib 5 and the strip 20 terminate in front of the forward edge of the source and drain contacts 3 and 4. In front of this, portions of the layer 2 are removed to define a rib 21 which also acts as a waveguide, which typically does not have a constant cross-section but functions as a transformer sections of waveguide. The optical input signal is launched into the structure in the region indicated generally at 22, from where it is guided to beneath the rib 5. Here it is coupled to the rib structure provided by rib 5 and is progressively absorbed by the material of the strip 20.

I claim:

1. A junction field effect transistor photodetector comprising: a semi-insulating substrate; a semiconductive layer of one type deposited on the substrate; and a relatively narrow rib of semiconductive material of an opposite type deposited on the layer and protruding therefrom; wherein source and drain contacts are provided on the semiconductive layer on opposite sides of the rib and a gate contact is provided on said rib, the rib has a root portion adjacent the layer formed of a higher band gap lower refractive index material covering an optically absorbing lower band gap higher refractive index material of said layer at or immediately beneath the root of the rib disposed such that the rib forms an optical waveguide adapted to guide light, and the lower band gap higher refractive index material of the layer absorbs light in said optical absorbing material.

2. A photodetector as claimed in claim 1 wherein said optically absorbing lower band gap material is constituted by a strip of material contiguous with said semiconductive layer on which source and drain contacts are provided.

3. A photodetector as claimed in claim 2 wherein said strip and said layer are of opposite conductivity type.

4. A photodetector as claimed in claim 2 wherein said strip and said layer are of the same conductivity type.

5. A photodetector as claimed in claim 1 wherein said rib structure optical waveguide is optically coupled with a further rib waveguide formed integrally with said junction field effect transistor in the material of said layer.

6. A photodetector as claimed in claim 1 wherein terminal connection with the gate contact of the junction field effect transistor is made by way of a terminal pad that is capacitatively decoupled from said layer to minimise its contribution to gate capacitance.

7. A photodetector as claimed in claim 6 including an insulating layer formed between the pad and the semiconductive layer for decoupling the pad from said semiconductive layer.

8. A photodetector as claimed in claim 6 wherein a trough is formed in the semiconductive layer for decoupling the pad from said layer.

9. A junction field effect transistor photodetector comprising: a semi-insulating substrate; a semiconductive layer of one type deposited on the substrate; and a relatively narrow rib or semiconductive material of an opposite type deposited on a free surface of the layer, said rib extending from a root portion adjacent the layer and protruding therefrom; source and drain contacts deposited on the semiconductive layer on opposite sides of the rib and a gate contact deposited on said rib, the root portion being formed of a material having a selected band gap and refractive index, the layer adjacent the root portion being covered thereby and formed of a material having a selected band gap higher than the rib material and a refractive index lower than said rib material gap such that the rib forms an optical waveguide adapted to guide light to the lower band gap higher refractive index material of the layer for absorption therein.

10. A photodetector as claimed in claim 9 including a transformer region formed in the semi-insulating layer for efficiently coupling light into said waveguide.

* * * * *